(12) United States Patent
Yan et al.

(10) Patent No.: US 6,607,862 B2
(45) Date of Patent: Aug. 19, 2003

(54) DAMASCENE EXTREME ULTRAVIOLET LITHOGRAPHY ALTERNATIVE PHASE SHIFT PHOTOMASK AND METHOD OF MAKING

(75) Inventors: Pei-Yang Yan, Saratoga, CA (US); Fu-Chang Lo, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/938,625

(22) Filed: Aug. 24, 2001

(65) Prior Publication Data

US 2003/0039894 A1 Feb. 27, 2003

(51) Int. Cl.[7] .................................................. G03F 9/00
(52) U.S. Cl. ........................................................ 430/5
(58) Field of Search ............................ 430/5, 322, 324; 378/34, 35

(56) References Cited

U.S. PATENT DOCUMENTS 5,328,784 A    7/1994   Fukuda

2002/0115000 A1 * 8/2002 Gupta et al. .................... 430/5

FOREIGN PATENT DOCUMENTS

JP     11305417      5/1999
WO    02 24659      2/2003

OTHER PUBLICATIONS

Masakiito, et al., "Optical Technology for EUV lithography," OSA TOPS on Extreme Ultraviolet Lithography, pp. 9–12, vol. 4 1996.

* cited by examiner

Primary Examiner—S. Rosasco
(74) Attorney, Agent, or Firm—Blakely, Sokoloff, Taylor & Zafman LLP (57) ABSTRACT

A photolithography mask is disclosed. The mask comprises a pattern layer that is selectively formed on a substrate in a photomask pattern. Next, a multilayer stack is formed on the pattern layer and the substrate. The multilayer stack is comprised of a plurality of pairs of thin films. Finally, an absorptive layer is disposed in trenches formed within the multilayer stack. The absorptive layer is absorptive of an EUV illuminating radiation. Further, the trenches are located substantially over the borders between the pattern layer and the substrate.

56 Claims, 5 Drawing Sheets

DAMASCENE EXTREME ULTRAVIOLET LITHOGRAPHY ALTERNATIVE PHASE SHIFT PHOTOMASK AND METHOD OF MAKING

TECHNICAL FIELD OF THE INVENTION

The present invention relates to photomasks, and more particularly, to an alternative phase shift mask (APSM) having a damascene structure formed for use with extreme ultraviolet lithography (EUVL).

BACKGROUND OF THE INVENTION

Photolithography is a common step used in the manufacture of integrated circuits. In photolithography, a photomask is placed above the wafer. The photomask (also known as a reticle) contains the pattern that is to be replicated onto the wafer. Illuminating radiation is then projected onto the photomask.

In the case of a transmissive photomask, the mask pattern is created by transmissive portions and absorbing portions arranged in the pattern on the mask. A selected wavelength, for example, 248 nanometers (nm), of irradiating radiation is shined through the mask. The transmissive portions of the mask, which are transparent to the selective wavelength, allow the light to pass through the mask. The absorbing portions, which are opaque to and absorb the selected wavelength, block the transmission. The pattern on the mask is thereby replicated onto the photoresist on the device wafer.

In another type of photomask, known as a reflective mask, the photomask surface contains reflective portions and absorbing portions. When light of a selected wavelength is applied to the photomask, the light is reflected off the reflecting portions. The reflected image from the mask usually is further reflected off of a mirror or lens system, then onto the wafer.

Reflective photomasks are used when the illuminating radiation is in the EUV range. Patterning of the transmission mask using deep UV radiation, such as 193 nm wavelength, and vacuum UW radiation, such as 157 nm wavelength, are all currently being developed. Because EUV radiation is strongly absorbed by condensed matter, such as quartz, a reflective photomask is commonly used for EUVL.

Another method of increasing the resolution of a photolithography system is to combine alternative phase shift mask (APSM) technology with a EUVL reflective photomask. In this method, selected portions of a photomask are manufactured to introduce a 180 degree phase shift in the reflected light. Thus, the reflected light from the phase shifted portions of the photomask will destructively interfere with the reflected light from the non-phase shifted portions. This destructive interference intensity pattern can be used to pattern the photoresist on a wafer. This technology is described in U.S. Pat. No. 5,328,784 to Fukuda and in "Optical Technology for EUV Lithography" by Ito et al., Optical Society of America, TOPS on Extreme Ultraviolet Lithography, Vol. 4 (1996).

Figure 1:
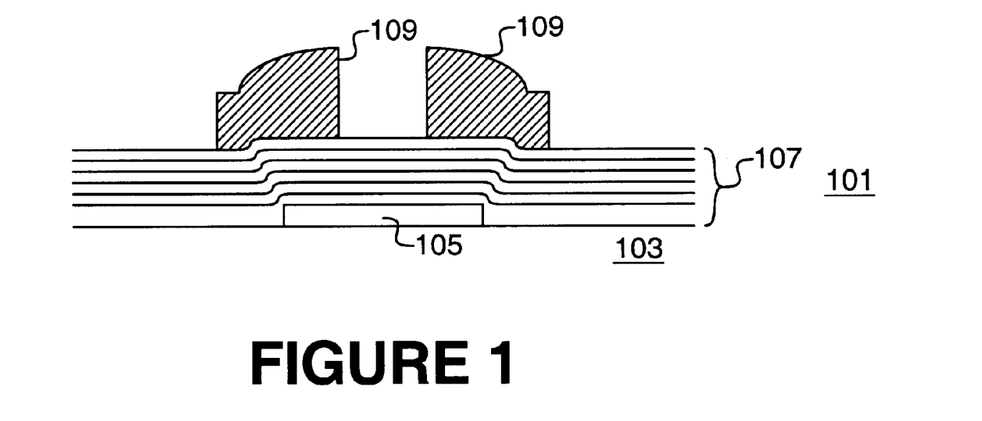
FIG. 1 is a prior art reflective EUVL alternative phase shift mask (APSM).

In the prior art reflective APSM, referring to FIG. 1, APSM 101 includes a substrate 103 that has various layers formed thereon. First, a phase shifting pattern 105 is deposited onto the substrate 103. The phase shifting pattern has a thickness of approximately ¼ of the illuminating radiation wavelength, i.e., $\lambda/4$. Next, a multilayer stack 107 comprising alternating thin film layers of molybdenum (Mo) and silicon (Si) is deposited. Typically, the multilayer stack 103 consists of 40 pairs of Mo/Si thin films, each pair of thin films approximately 7 nm in thickness. The multilayer stack 103 will reflect EUV radiation. Formed atop of the multilayer stack 103 is a patterned absorptive metal layer 109. The patterned absorptive metal layer 109 covers the transitions between areas of the substrate 103 that have the phase shift patterns 105 and those that do not. By varying the widths of the absorptive metal layer 109, features having different sizes can be patterned.

This prior art photomask has some disadvantages. First, the photomask 101 of FIG. 1 introduces a shadowing effect. In EUVL, the incident radiation comes at an angle from normal due to the nature of a reflective mask. The combination of oblique illumination with a non-zero height of the absorptive metal layer 109 causes a shadowing effect, which needs to be corrected by adjusting the size of the photomask features. Typically, the photomask is biased toward a smaller dimension in order to compensate for the shadowing effect. As EUVL technology extends to smaller design rules, the biasing requirement may place a limitation on EUVL mask fabrication. Further, the prior art photomask 101 is not planar, leading to possible damage during cleaning of the surface of the photomask. Other disadvantages of the prior art photomask 101 will become apparent as the detailed description of the present invention is reviewed.

BRIEF DESCRIPTION OF THE DRAWINGS

The invention is best understood by reference to the figures wherein references with like reference numbers generally indicate identical, functionally similar, and/or structurally similar elements.

DETAILED DESCRIPTION OF THE PREFERRED EMBODIMENTS

In accordance with the present invention, a method for forming an extreme ultraviolet lithography (EUVL) reflective alternative phase shift mask (APSM) is disclosed. In the following description of the preferred embodiments, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, operations are not shown or described in detail to avoid obscuring aspects of the invention.

Reference throughout this specification to "one embodiment", "an embodiment", or "preferred embodiment" means that a particular feature, structure, or characteristic described in connection with the embodiment is included in at least one embodiment of the present invention. Thus, the appearance of the phrase "in one embodiment", "in an embodiment", or "in a preferred embodiment" in various places throughout the specification are not necessarily all referring to the same embodiment. Furthermore, the particular features, structures, or characteristic may be combined in any suitable manner in one or more embodiments.

Figure 2:
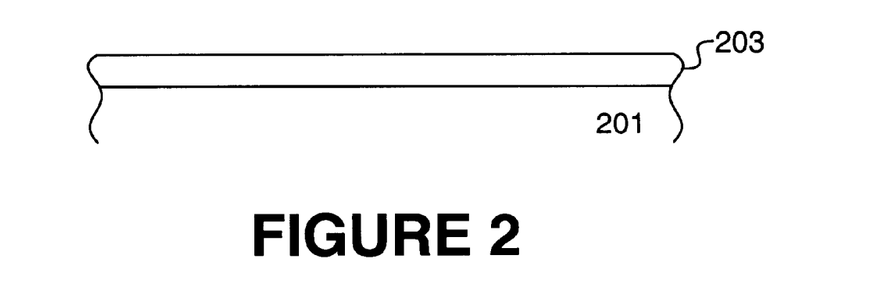
FIGS. 2–7 are cross sectional views illustrating a method for forming an APSM reflective EUVL photomask in accordance with the present invention.

Referring to FIG. 2, a substrate 201 is provided upon which a pattern layer 203 is deposited. In one embodiment, the substrate 201 may be silicon and the pattern layer 203 may be silicon dioxide. However, a host of other materials may be used for both structures, insofar as the purpose of the substrate 201 is primarily to provide a base upon which the reflective and absorptive portions of the photomask may be formed. Therefore, the substrate 201 may be formed from materials, such as quartz, ultra-low expansion titanium silicate glass (ULE), and zerodur which exhibit good thermal stability.

Similarly, as will be seen below, the primary purpose of the pattern layer 203 is to provide raised areas that will cause a 180 degree phase shift in reflected illuminating radiation. Thus, the pattern layer 203 may be formed from several types of material. Some considerations for selecting the material comprising the pattern layer 203 are that (1) the material should be capable of being easily and uniformly deposited over the substrate 201 with near zero defect and (2) the material should have good etching selectivity to the substrate 201. If the substrate is silicon or silicon dioxide, the pattern layer 203 may be formed, for example, from carbon. The advantage of using carbon as the pattern layer 203 is that optical inspection may be used to determine if defects in etching of the pattern layer 203 are present.

Generally, the pattern layer 203 should have a thickness that will cause about a 180 degree phase shift in illuminating radiation reflected from the raised areas relative to illuminating radiation reflected from unraised areas of the substrate (where pattern layer 203 is not present). It has been found that a pattern layer 203 having a thickness of $\lambda/(4 \cos \theta)$ is appropriate for generating a 180 degree phase shift, where $\lambda$ is the wavelength of the illuminating radiation and $\theta$ is the incident angle. For 13.4 nm EUV wavelength and an incident angle of 5 degrees, the pattern layer 203 should thus have a thickness of about 3.36 nm.

Figure 3:
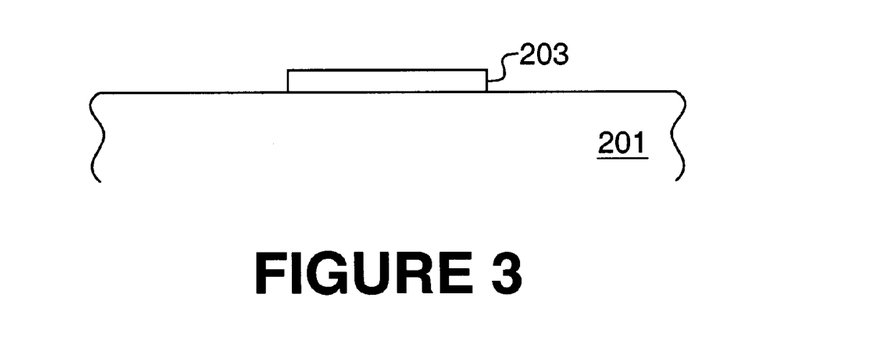

Next, turning to FIG. 3, the pattern layer 203 is then patterned and etched to leave raised areas on the substrate 201. It can be appreciated that the pattern layer 203 shown in FIG. 3 is merely illustrative and that in actual practice, pattern layer 203 is typically a complicated network that defines the pattern of the photomask. Thus, pattern layer 203 is formed throughout the photomask in the desired photomask pattern.

Figure 4:
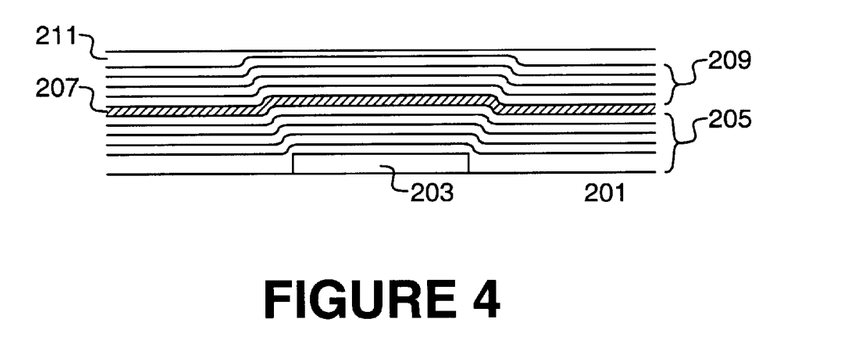

Next, turning to FIG. 4, a multilayer stack 205 is deposited over the substrate 201 and the remaining portions of the pattern layer 203. In one embodiment, 40 pairs of molybdenum/silicon thin films comprise multilayer stack 205. However, other materials may be used to form the pairs of thin films and the present invention should not be limited to molybdenum/silicon thin films. For example, molybdenum/beryllium, niobium/beryllium, ruthenium/beryllium, rhodium/beryllium, or silicon/ruthenium thin film pairs may be used. Further, the pairs of thin films may include an interlayer between the first and second films to increase thermal stability and to prevent interdiffusion. The interlayer may be, for example, carbon.

Typically, each pair of molybdenum/silicon thin films is approximately 7 nm (or 70 angstroms) thick. Using known physical relationships, it has been found theoretically that 40 pairs (or 280 nm thickness) of molybdenum/silicon thin films will provide nearly 75% reflectivity for wavelengths in the EUV band (e.g., 13.4 nm).

Still referring to FIG. 4, a buffer layer 207 is then deposited over the multilayer stack 205. As will be seen below, the buffer layer 207 will be used as an etch stop. The buffer layer 207 should be of a material that has good etching selectivity between the buffer material and molybdenum/silicon. For example, carbon may be used. Nevertheless, other materials, such as oxide, chromium, or ruthenium may be used as the buffer layer. In an alternative embodiment, the buffer layer 207 is omitted.

Still referring to FIG. 4, in accordance with the present invention, an additional number of pairs of molybdenum/silicon thin films are deposited over the buffer layer 207. In one embodiment, 10 pairs of thin films are deposited, resulting in an additional 70 nm in thickness. These 10 pairs of molybdenum/silicon thin films are referred to herein as supplemental multilayer stack 209.

Nevertheless, as noted above, other types of reflective thin film combinations may be used for the supplemental multilayer stack 209. Indeed, the thin film combination used for the supplemental multilayer stack 209 may be different from the thin film combination used for the multilayer stack 205. As will be seen below, trenches will be formed in the stack of thin films.

Next, still referring to FIG. 4, a planarizing cap layer 211 is deposited over the supplemental multilayer stack 209. The cap layer 211 is preferably on the order of 40 to 120 angstroms thick. In one embodiment, the cap layer 211 is formed from silicon. Alternatively, the cap layer 211 may be formed from other materials, such as ruthenium.

Figure 5:
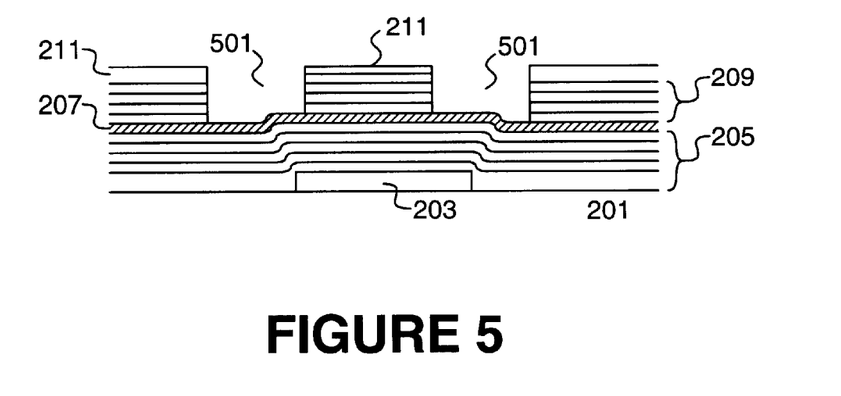

Next, referring to FIG. 5, trenches 501 are formed in the cap silicon layer 211 and supplemental multilayer stack 209. The trenches 501 may be formed using conventional patterning and etching processes. The buffer layer 207 is used as an etch stop layer, and thus, the trenches 501 extend down through the entire supplemental multilayer stack 209 to the buffer layer 207. Further, generally, the trenches 501 are formed to be substantially over the borders between the pattern layer 203 and the substrate 201.

Although not required, the buffer layer 207 is preferably formed to a thickness dependent upon the wavelength of the illuminating radiation, the real portion of the index of refraction of the etching stop layer (n), and the angle of incidence of the illuminating radiation ($\theta$) by the following relationship:

$$\text{Thickness} = m\lambda/(2n \cos \theta)$$

where m is an integer.

Thus, for an angle of incidence of 5 degrees, an exposure wavelength of 134 angstroms, using oxide as the buffer layer having a real index of refraction of 0.9735, the optimal thickness is about 7 nm. For a ruthenium buffer layer, the optimal thickness is still approximately 7 nm. The buffer layer 207 can be formed from an oxide, carbon, chromium, ruthenium, or other materials.

The formula given above is valid for multilayer stacks 205 and 209 that have a substantially uniform periodicity. Periodicity refers to a consistent pattern of thin film thickness for the molybdenum/silicon thin film pairs. In one example, this results in pairs of 2.8 nm molybdenum thin film and 4.2 nm silicon thin film. For other types of materials forming the thin film pairs, it can be appreciated that other thicknesses are used. In any event, a uniform periodicity refers to having consistent thicknesses in the thin film pairs through out the multilayer stacks 205 and 209.

In broader terms, the thickness of the buffer layer, including for any overages or underages in thickness relative to uniform periodicity in the thin film layers directly adjoining the buffer layer, should have an optical path that is a multiple of $2\pi$. Thus, as an example, assume that the topmost thin film layer in the multilayer stack 205 is 5.2 nm, instead of the nominal 4.2 nm thickness. In such a situation, 1.0 nm of this thickness should be accounted for as part of the buffer layer in calculating its optical path.

The buffer layer 207 serves at least two functions. First, when the trenches 501 are formed in the supplemental multilayer stack 209, the precise depth of the trenches 501 can be uniformly controlled. Second, if an error made in the etching process of the trenches 501 is discovered, the supplemental multilayer stack 209 (and cap layer 211) can be stripped away and a new supplemental multilayer stack 209 can be formed or the multilayer stack 205. Thus, errors in patterning can be corrected without destroying an expensive mask blank. Conceivably, mask blanks may be even reused.

It can be appreciated that the trenches 501 shown in FIG. 5 are merely illustrative and that in actual practice, trenches 501 are typically a complicated network that defines the pattern of the photomask. Thus, trenches 501 are formed throughout the photomask in the desired photomask pattern.

Figure 6:
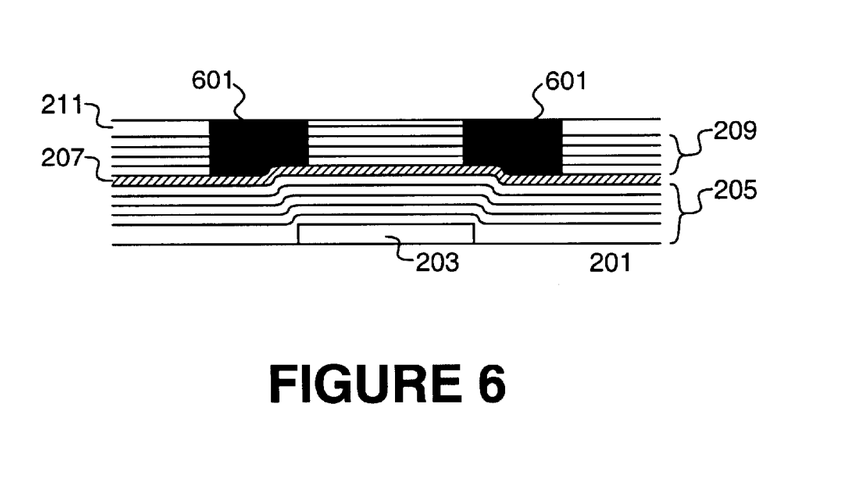

Next, turning to FIG. 6, the trenches 501 are filled with a metal layer 601, typically using a blanket sputter process. Alternatively, physical vapor or chemical vapor deposition may also be used. The metal layer 601 may be, for example, tantalum nitride, tungsten, copper, chrome, tantalum, tantalum nitride, aluminum, germanium. or silicon germanium. It has been found preliminarily that germanium or aluminum provide a preferred level of performance as the metal layer 601.

Indeed, any material that is generally absorptive of EUVL radiation may be used. However, it should be noted that the more absorptive the material used, the lower the thickness of the supplemental multilayer stack 209 need be.

Still referring to FIG. 6, the portion of the metal layer 601 that is outside trenches 501 is removed. Typically, this is accomplished using a chemical mechanical polishing (CMP) process, using the cap layer 211 as a polish stop. Thus, it is preferred that the cap layer 211 be formed from a material that has good polishing selectivity to the metal layer 601. Still alternatively, the portion of the metal layer 601 that is outside trenches 501 is removed using an etch back process.

Figure 7:
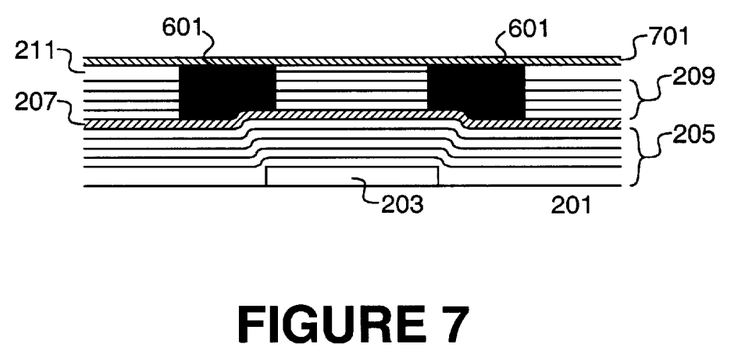

Finally, turning to FIG. 7, as an optional step, a thin amorphous silicon layer 701 is deposited over the cap layer 211 and the metal layer 601 within the trenches 501. The thickness of the amorphous silicon layer 701 is preferably a few angstroms, in the range of 40 to 120 angstroms.

Several advantages of the photomask of FIG. 7 can be seen. First, because the incident EUV radiation is reflected by the supplemental multilayer stack 209, which is at substantially the same planar level as the metal layer 601, the shadowing effect is nearly nonexistent.

Second, because the multilayer stack 203 and the supplemental multilayer stack 301 are conductive, the overall conductivity of the photomask is increased, which facilitates protection of the photomask from particle contamination.

Third, the photomask design of the present invention is amenable to optical inspection and focused ion beam (FIB) repair technology for opaque etched defects. Other known techniques for repairing clear defects may also be used. For example, one method is described in U.S. Pat. No. 5,935,737 to Yan and assigned to the same assignee as the present invention.

Fourth, because the surface of the photomask is substantially flat, it can be easily cleaned, when compared to prior art EUVL reflective alternative phase shift photomasks. Moreover, because of the cap layer 211 and the optional amorphous silicon layer 701, cleaning processes will not damage the underlying supplemental multilayer stack 209 or the metal layer 601.

The present invention can be modified to aid in the inspection and repair of the photomask during its manufacture. In particular, turning to FIG. 8, in addition to the multilayer stack 205, the buffer layer 207, the supplemental multilayer stack 209, and the cap layer 211 being deposited, a contrasting layer 801 is also deposited. The contrasting layer 801 is a material that can provide good contrast between the etched and unetched regions (for forming trenches 501) using optical inspection techniques. In one embodiment, the contrast layer 801 can be formed from carbon, assuming the underlying cap layer is made from silicon dioxide, or other material that contrasts well with carbon. Titanium nitride, tantalum nitride, or chromium may also be used as a contrast layer 801.

Figure 9:
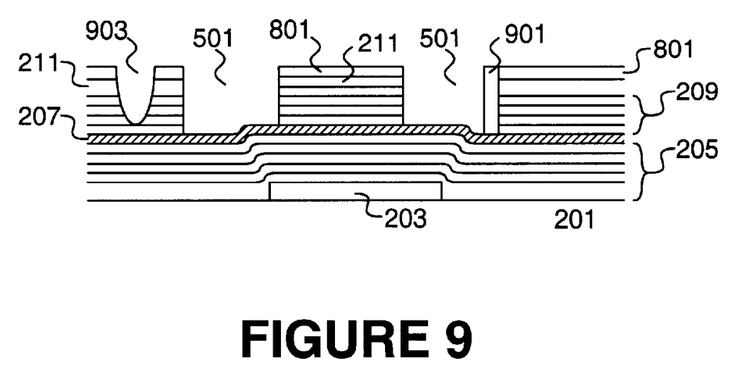

After patterning and etching of the photomask, optical inspection can be conducted because a high optical contrast can be obtained between the etched region and the unetched region covered by the contrast layer 801. In FIG. 9, two types of defects are shown: a protrusion defect 901 and an intrusion defect 903. A protrusion defect is an area of the photomask that should be etched, but has not been etched. An intrusion defect is an area of the photomask that should not be etched, but has been etched. A protrusion defect can be repaired using conventional focused ion beam (FIB) technology to remove the protrusion defect 803. An intrusion defect 903 should be avoided in the patterning process by using other known techniques. For example, one method is described in U.S. Pat. No. 5,935,737 to Yan and assigned to the same assignee as the present invention. However, the use of the contrast layer 801 is useful for identifying the defects using optical techniques.

The remaining steps shown in FIGS. 6–7 may then be carried out after the defects are removed. Thus, the metal layer 601 is deposited over the photomask and a metal CMP process is performed. The contrasting layer 801, in one embodiment carbon, may also serve as a CMP stop layer. After the CMP process is stopped on the contrast layer 801, the surface of the metal layer 601 is significantly more planar. This in turn insures increased uniformity control in the next polishing step to remove the contrast layer 801. In this example, the cap layer 211 is used as the stop layer. Any carbon residue can be removed via oxygen plasma etching.

Figure 8:
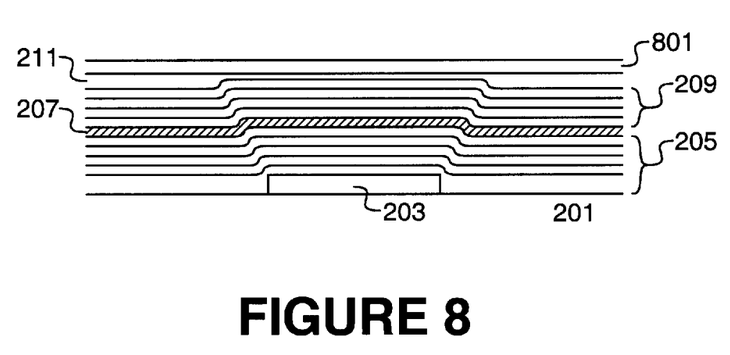
FIGS. 8–9 are cross sectional views of an alternative embodiment of the present invention using a contrast layer.

Alternatively, the contrast layer 801 may be removed by a conventional lift-off process. In this case, the thickness of the contrast layer is preferably less than 20 nanometers. Although this method results in a surface that is not as planar as obtained using a CMP process, this technique is still more planar than a photomask fabricated using a subtractive metal technique. The advantage of removing contrast layer 801 by a lift-off process is to retain a good film uniformity of the capping layer 211. A wet or dry etch process usually can achieve higher selectivity to the silicon capping layer as compared to the CMP process.

Still alternatively, before removing the contrast layer by lift-off process, a blanket etch of the metal layer 601 may be performed so as to recess the metal layer 601 under the capping layer 211 or the supplemental multilayer stack 209. The recess depth can be in a range of 0–30 nm. The contrast layer 801 is then removed using a lift-off process by either a dry or wet etch. For certain metals forming the metal layer 601, the recessed metal layer has performance advantages.

Finally, like the embodiment described above, a thin amorphous silicon coating may be placed over the photomask as an optional step. Another advantage of using the contrast layer 801 is that the contract layer 801 can be used as an "etching test layer". Thus, any errors in the etching pattern to be imprinted onto the photomask can be determined by first etching the contrast layer 801. If errors are found, then the contrast layer 801 can be repaired. Then, the contrast layer 801 can be used as a hard mask to etch the underlying supplemental multilayer stack 209.

Turning next to FIGS. 10–13, an alternative embodiment of the present invention is shown. In this embodiment, instead of using a pattern layer 203 to raise portions of the multilayer stack 205, the underlying substate is etched so as to leave recessed regions that will lower portions of the multilayer stack 205.

Figure 10:
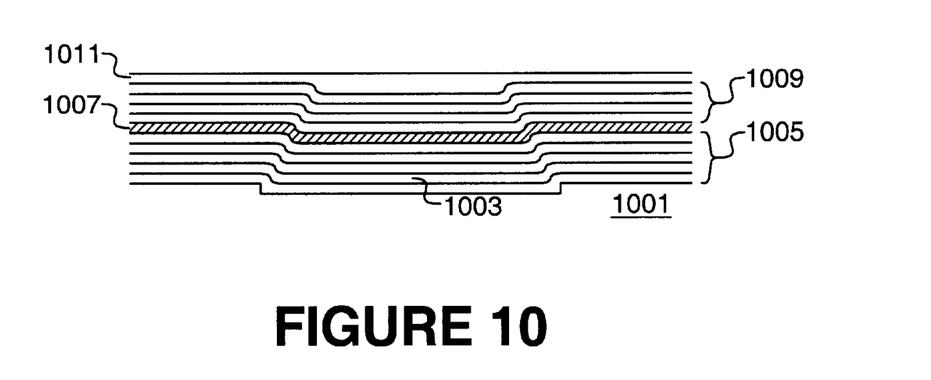
FIGS. 10–13 are cross sectional views illustrating a method for forming an EUVL reflective APSM in accordance with an alternate embodiment of the present invention.

Turning to FIG. 10, a substrate 1001 is provided. The substrate is patterned and etched to provide recesses 1003. In one embodiment, the substrate 1001 may be silicon or an oxide. As noted above, a host of other materials may be used for both structures, insofar as the purpose of the substrate 1001 is primarily to provide a base upon which the reflective and absorptive portions of the photomask may be formed. Therefore, the substrate 1001 may be formed from materials, such as quartz, ultra-low expansion titanium silicate glass (ULE), and zerodur which exhibits- good thermal stability.

As will be seen below, the primary purpose of the recesses 1003 is to provide lowered areas that will cause a phase shift in reflected illuminating radiation. It can be appreciated that the recess 1003 shown in FIG. 10 are merely illustrative and that in actual practice, recess 1003 is typically a complicated network that defines the pattern of the photomask. Thus, recesses 1003 are formed throughout the photomask in the desired photomask pattern. One disadvantage of the embodiment of FIGS. 10–13 compared to the embodiment of FIGS. 2–7 is that optical inspection may not be used to determine if defects in etching of the recesses 1003 are present. This is because there is little to no optical difference between the recesses 1003 and the substrate 1001.

Generally, recesses 1003 should have a depth that will cause about a 180 degree phase shift in illuminating radiation reflected from the lowered areas relative to illuminating radiation reflected from unlowered areas of the substrate (where recesses 1003 are not present). It has been found that recesses 1003 having a depth of $\lambda/(4 \cos \theta)$ is appropriate for generating a 180 degree phase shift, where $\lambda$ is the wavelength of the illuminating radiation and $\theta$ is the incident angle. For 13.4 nm EUV wavelength and 5 degrees incident angle, the recesses 1003 should thus have a depth of about 3.36 nm.

Next, still referring to FIG. 10, a multilayer stack 1005 is deposited over the substrate 1001 and into recesses 1003. In one embodiment, 40 pairs of molybdenum/silicon thin films comprise multilayer stack 1005. However, other materials may be used to form the pairs of thin films and the present invention should not be limited to molybdenum/silicon thin films. For example, molybdenum/beryllium, niobium/beryllium, ruthenium/beryllium, rhodium/beryllium, or silicon/ruthenium thin film pairs may be used. Further, the pairs of thin films may include an interlayer between the first and second films to increase thermal stability and to prevent interdiffusion. The interlayer may be, for example, carbon.

Typically, each pair of molybdenum/silicon thin films is approximately 7 nm (or 70 angstroms) thick. Using known physical relationships, it has been found theoretically that 40 pairs (or 280 nm thickness) of molybdenum/silicon thin films will provide nearly 75% reflectivity for wavelengths in the EUV band (e.g., 13.4 nm).

Still referring to FIG. 10, a buffer layer 1007 is then deposited over the multilayer stack 1005. As will be seen below, the buffer layer 1007 will be used as an etch stop. The buffer layer 1007 should be of a material that has good etching selectivity between the buffer material and molybdenum/silicon. For example, carbon may be used. Nevertheless, other materials, such as silicon oxide, chromium, or ruthenium may be used as the buffer layer. In an alternative embodiment, the buffer layer 207 is omitted.

Still referring to FIG. 10, in accordance with the present invention, an additional number of pairs of molybdenum/silicon thin films are deposited over the buffer layer 1007. In one embodiment, 10 pairs of thin films are deposited, resulting, in an additional 70 nm in thickness. These 10 pairs of molybdenum/silicon thin films are referred to herein as supplemental multilayer stack 1009.

Nevertheless, as noted above, other types of reflective thin film combinations may be used for the supplemental multilayer stack 1009. Indeed, the thin film combination used for the supplemental multilayer stack 1009 may be different from the thin film combination used for the multilayer stack 1005. As will be seen below, trenches will be formed in the stack of thin films.

Next, a planarizing cap layer 1011 is deposited over the supplemental multilayer stack 1009. The cap layer 1011 is preferably on the order of 40 to 120 angstroms thick. In one embodiment, the cap layer 1011 is formed from silicon. Alternatively, the cap layer 1011 may be formed from other materials, such as ruthenium.

Figure 11:
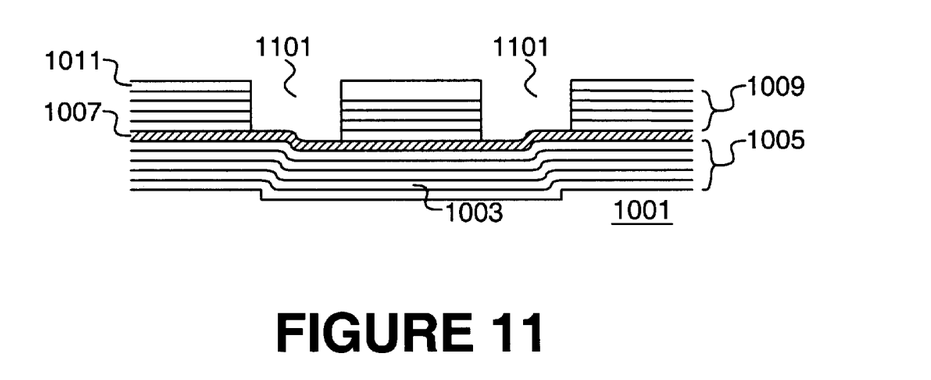

Next, referring to FIG. 11, trenches 1101 are formed in the cap layer 1011 and supplemental multilayer stack 1009. The trenches 1101 may be formed using conventional patterning and etching processes. The buffer layer 1007 is used as an etch stop layer, and thus, the trenches 1101 extend down through the entire supplemental multilayer stack 1009 to the buffer layer 1007.

Although not required, the buffer layer 1007 is preferably formed to a thickness dependent upon the wavelength of the illuminating radiation, the real portion of the index of refraction of the etching stop layer (n), and the angle of incidence of the illuminating radiation ($\theta$) by the following relationship:

$$\text{Thickness}=m\lambda/(2n \cos \theta)$$

where m is an integer.

Thus, for an angle of incidence of 5 degrees, an exposure wavelength of 134 angstroms, using oxide as the buffer layer having a real index of refraction of 0.9735, the optimal thickness is about 7 nm. For a ruthenium buffer layer, the optimal thickness is still approximately 7 nm. The buffer layer 1007 can be formed from an oxide, carbon, chromium, ruthenium, or other materials.

The formula given above is valid for a multilayer stacks 1005 and 1009 that has a substantially uniform periodicity. Periodicity refers to a consistent pattern of thin film thickness for the molybdenum/silicon thin film pairs. In one example, this results in pairs of 2.8 nm molybdenum thin film and 4.2 nm silicon thin film. For other types of materials forming the thin film pairs, it can be appreciated that other thicknesses are used. In any event, a uniform periodicity refers to having consistent thicknesses in the thin film pairs throughout the multilayer stacks 1005 and 1009.

In broader terms, the thickness of the buffer layer, including for any overages or underages in thickness relative to uniform periodicity in the thin film layers directly adjoining the buffer layer, should have an optical path that is a multiple of $2\pi$. Thus, as an example, assume that the topmost thin film layer in the multilayer stack 1005 is 5.2 nm, instead of the nominal 4.2 nm thickness. In such a situation, 1.0 nm of this thickness should be accounted for as part of the buffer layer in calculating its optical path.

The buffer layer 1007 serves at least two functions. First, when the trenches 1101 are formed in the supplemental multilayer stack 1009, the precise depth of the trenches 1101 can be uniformly controlled. Second, if an error is made in the etching process of the trenches 1101 is discovered, the supplemental multilayer stack 1009 (and cap layer 1011) can be stripped away and a new supplemental multilayer stack 1009 can be formed on the multilayer stack 1005. Thus, errors in patterning can be corrected without destroying an expensive mask blank. Conceivably, mask blanks may be even reused.

It can be appreciated that the trenches 1101 shown in FIG. 11 are merely illustrative and that in actual practice, trenches 1101 are typically a complicated network that defines the pattern of the photomask. Thus, trenches 1101 are formed throughout the photomask in the desired photomask pattern. Further, generally, the trenches 1101 are formed to be substantially over the borders between the recesses 1003 and the substrate 1001.

Figure 12:
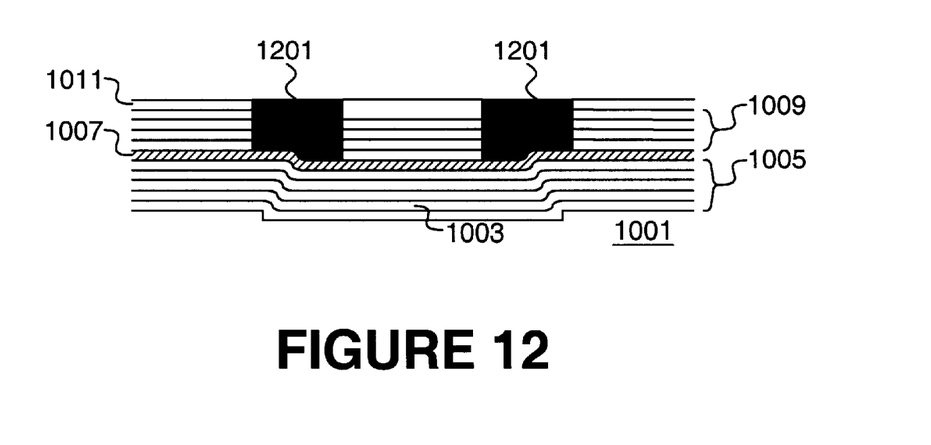

Next, turning to FIG. 12, the trenches 1101 are filled with a metal layer 1201, typically using a blanket sputter process. Alternatively, physical vapor or chemical vapor deposition may also be used. The metal layer 1201 may be, for example, tantalum nitride, tungsten, copper, chrome, tantalum, tantalum nitride, aluminum, germanium, or silicon germanium. It has been found preliminarily that germanium or aluminum provide a preferred level of performance as the metal layer 1201.

Indeed, any material that is generally absorptive of EUVL radiation may be used. However, it should be noted that the more absorptive the material used, the lower the thickness of the supplemental multilayer stack 1009 need be.

Still referring to FIG. 12, the portion of the metal layer 1201 that is outside trenches 1101 is removed. Typically, this is accomplished using a chemical mechanical polishing (CMP) process, using the cap layer 1011 as a polish stop. Thus it is preferred that the cap layer 211 be formed from a material that has good polishing selectivity to the metal layer 1201. Still alternatively, the portion of the metal layer 1201 that is outside trenches 1101 is removed using an etch back process.

Figure 13:
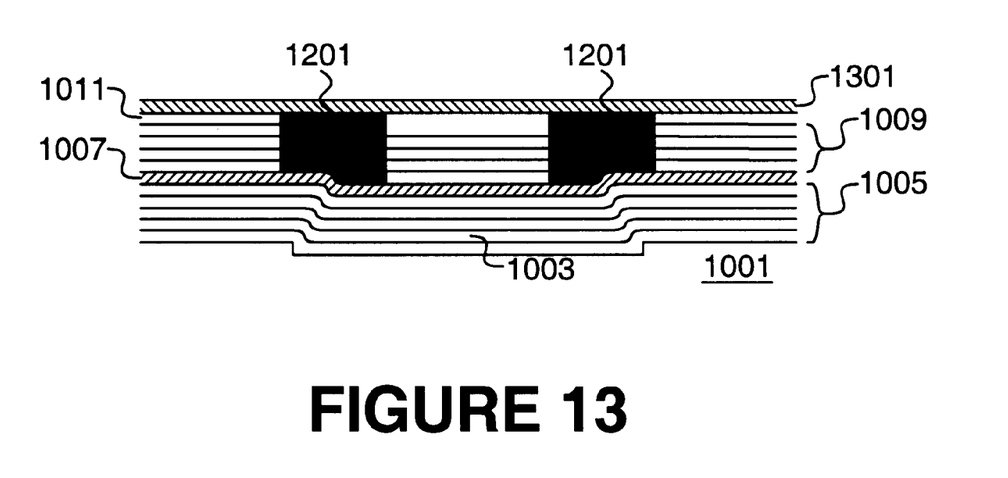

Finally, turning to FIG. 13, as an optional step, a thin amorphous silicon layer 1301 is deposited over the cap layer 1011 and the metal layer 1201 within the trenches 1101. The thickness of the amorphous silicon layer 1301 is preferably a few angstroms, in the range of 40 to 120 angstroms.

While specific embodiments of, and examples for, the invention are described herein for illustrative purposes, various equivalent modifications are possible within the scope of the invention, as those skilled in the art will recognize. These modifications can be made to the invention in radiation of the detailed description. The terms used in the following claims should not be construed to limit the invention to specific embodiments disclosed in the specification and the claims. Rather, the scope of the invention is to be determined entirely by the following claims, which are to be construed in accordance with established doctrines of claim interpretation.

What is claimed is:

1. A photolithography mask for use with extreme ultraviolet lithography (EUVL) that uses extreme ultraviolet (EUV) illuminating radiation, said mask comprising:

a pattern layer selectively formed on a substrate in a photomask pattern;

a multilayer stack formed over said pattern layer and said substrate that is substantially reflective of said EUV illuminating radiation;

a supplemental multilayer stack formed atop said multilayer stack; and an absorber material formed in trenches patterned into said supplemental multilayer stack, said absorber material being substantially absorptive of said EUV illuminating radiation, said trenches being located substantially over the borders between said pattern layer and said substrate.

2. The mask of claim 1 further comprising a cap layer formed over said supplemental multilayer stack.

3. The mask of claim 2 further comprising a thin amorphous silicon layer formed over said cap layer and said absorptive material.

4. The mask of claim 1 wherein said multilayer stack and said supplemental multilayer stack are formed from pairs comprising a molybdenum thin film and a silicon thin film.

5. The mask of claim 1 wherein said absorptive layer is formed from chromium, tungsten, tantalum, tantalum nitride, aluminum, germanium, silicon germanium or copper.

6. The mask of claim 1 wherein the top of said absorptive layer is substantially planar with the top of said supplemental multilayer stack.

7. The mask of claim 1 further including a buffer layer formed between said multilayer stack and said supplemental multilayer stack.

8. The mask of claim 7 wherein said buffer layer has a thickness dependent upon the wavelength of the EUV illuminating radiation, the real portion of the index of refraction of the etching stop layer (n), and the angle of incidence of the EUV illuminating radiation ($\theta$) by the following relationship:

$$\text{Thickness} = m\lambda/(2n \cos \theta)$$

where m is an integer.

9. The mask of claim 7 wherein said buffer layer, including any overages or underages in thickness relative to uniform periodicity in said multiplayer stack adjoining the buffer layer, has a thickness that provides an optical path that is an integer multiple of $2\pi$.

10. The mask of claim 7 wherein said buffer layer is formed from carbon, chromium, oxide, or ruthenium.

11. The mask of claim 1 wherein said pattern layer has a thickness approximately 1/(4 cos $\theta$) of the wavelength of said EUV illuminating radiation, where $\theta$ is the incident angle.

12. A photolithography mask comprising:

a pattern layer selectively formed on a substrate in a photomask pattern;

a multilayer stack formed on said pattern layer and said substrate comprised of a plurality of pairs of thin films; and an absorptive layer disposed in trenches formed within said multilayer stack, said absorptive layer being substantially absorptive of an EUV illuminating radiation, said trenches being located substantially over the borders between said pattern layer and said substrate.

13. The photolithography mask of claim 12 wherein said pairs of thin films comprise a molybdenum thin film and a silicon thin film.

14. The photolithography mask of claim 12 wherein said absorptive layer is formed from chromium, tantalum, tantalum nitride, tungsten, aluminum, germanium, silicon germanium or copper.

15. The photolithography mask of claim 12 further comprising a cap layer formed atop of said multilayer stack.

16. The photolithography mask of claim 15 wherein the top of said absorptive layer is substantially planar with the top of said cap silicon layer.

17. The photolithography mask of claim 12 wherein the top of said absorptive layer is substantially planar with the top of said multilayer stack.

18. A method for forming a photolithography mask comprising:
  providing a pattern layer selectively disposed upon a substrate, said pattern layer in a photomask pattern;
  forming over said pattern layer and said substrate a multilayer stack comprised of a plurality of pairs of thin films;
  forming a supplemental multilayer stack on said multilayer stack;
  patterning and etching trenches in said supplemental multilayer stack, said trenches being located substantially over the borders between said pattern layer and said substrate; and
  forming an absorptive layer into said trenches, said absorptive layer being substantially absorptive of an EUV illuminating radiation.

19. The method of claim 18 further comprising forming a cap layer over said multilayer stack prior to the formation of said trenches.

20. The method of claim 19 further comprising forming a thin amorphous silicon layer over said cap silicon layer and said absorptive layer.

21. The method of claim 19, further comprising depositing a contrast layer atop said cap layer prior to formation of the trenches.

22. The method of claim 21 further comprising repairing defects in said photolithography mask after the formation of said trenches.

23. The method of claim 21 wherein said contrast layer is removed by a lift-off technique.

24. The method of claim 21 wherein said etching stop layer is formed from carbon, chromium, oxide, or ruthenium.

25. The method of claim 21 further comprising:
  etching said absorptive layer such that said absorptive layer is recessed into said trenches; and
  removing said contrast layer.

26. The method of claim 18 wherein said absorptive layer comprises aluminum, titanium, tungsten, chromium, copper, germanium, silicon germanium, tantalum, or tantalum nitride.

27. The method of claim 18 wherein the forming of said absorptive layer comprises:
  depositing said absorptive layer over said multilayer stack and into said trenches; and
  performing a chemical mechanical polishing step to remove a portion of said absorptive layer outside of said trenches.

28. The method of claim 18, further comprising depositing a contrast layer atop said multilayer stack prior to formation of the trenches.

29. The method of claim 18 further including forming a buffer layer between said multilayer stack and said supplemental multilayer stack.

30. The method of claim 29 wherein said buffer layer has a thickness dependent upon the wavelength of said EUV illuminating radiation, the real portion of the index of refraction of the etching stop layer (n), and the angle of incidence of the EUVL irradiation (θ) by the following relationship:

$$\text{Thickness} = m\lambda/(2n \cos \theta)$$

where m is an integer.

31. The mask of claim 29 wherein said buffer layer, including any overages or underages in thickness relative to uniform periodicity in said multiplayer stack adjoining the buffer layer, has a thickness that provides an optical path that is an integer multiple of 2π.

32. The mask of claim 18 wherein said pattern layer has a thickness approximately ¼ of the wavelength of said EUV illuminating radiation.

33. A photolithography mask for use with extreme ultraviolet lithography (EUVL) that uses extreme ultraviolet (EUV) illuminating radiation, said mask comprising:
  a substrate having recesses etched therein to form a photomask pattern;
  a multilayer stack formed over said recesses and said substrate that is substantially reflective of said EUV illuminating radiation;
  a supplemental multilayer stack formed atop said multilayer stack; and
  an absorber material formed in trenches patterned into said supplemental multilayer stack, said absorber material being substantially absorptive of said EUV illuminating radiation, said trenches being located substantially over the borders between said recesses and said substrate.

34. The mask of claim 33 further comprising a cap layer formed over said supplemental multilayer stack.

35. The mask of claim 34 further comprising a thin amorphous silicon layer formed over said cap layer and said absorptive material.

36. The mask of claim 33 wherein said multilayer stack and said supplemental multilayer stack are formed from pairs comprising a molybdenum thin film and a silicon thin film.

37. The mask of claim 33 wherein said absorptive layer is formed from chromium, tungsten, tantalum, tantalum nitride, aluminum, germanium, silicon germanium or copper.

38. The mask of claim 33 further including a buffer layer formed between said multilayer stack and said supplemental multilayer stack.

39. The mask of claim 38 wherein said buffer layer has a thickness dependent upon the wavelength of the EUV illuminating radiation, the real portion of the index of refraction of the etching stop layer (n), and the angle of incidence of the EUV illuminating radiation (θ) by the following relationship:

$$\text{Thickness} = m\lambda/(2n \cos \theta)$$

where m is an integer.

40. The mask of claim 38 wherein said buffer layer, including any overages or underages in thickness relative to uniform periodicity in said multiplayer stack adjoining the buffer layer, has a thickness that provides an optical path that is an integer multiple of 2π.

41. The mask of claim 38 wherein said buffer layer is formed from carbon, chromium, oxide, or ruthenium.

42. The mask of claim 33 wherein said recesses have a depth approximately ¼ of the wavelength of said EUV illuminating radiation.

43. A method for forming a photolithography mask comprising:
  selectively etching a substrate such that recesses are formed, said recesses in a photomask pattern;

forming over said recesses and said substrate a multilayer stack comprised of a plurality of pairs of thin films;

forming a supplemental multilayer stack on said multilayer stack;

patterning and etching trenches in said supplemental multilayer stack, said trenches being located substantially over the borders between said recesses and said substrate; and forming an absorptive layer into said trenches, said absorptive layer being substantially absorptive of an EUV illuminating radiation.

44. The method of claim 43 further comprising forming a cap layer over said multilayer stack prior to the formation of said trenches.

45. The method of claim 44 further comprising forming a thin amorphous silicon layer over said cap silicon layer and said absorptive layer.

46. The method of claim 43 wherein said absorptive layer comprises aluminum, titanium, tungsten, chromium, copper, germanium, silicon germanium, tantalum, or tantalum nitride.

47. The method of claim 43 wherein the forming of said absorptive layer comprises:

depositing said absorptive layer over said multilayer stack and into said trenches; and performing a chemical mechanical polishing step to remove a portion of said absorptive layer outside of said trenches.

48. The method of claim 43, further comprising depositing a contrast layer atop said multilayer stack prior to formation of the trenches.

49. The method of claim 48 further comprising repairing defects in said photolithography mask after the formation of said trenches.

50. The method of claim 48 wherein said contrast layer is removed by a lift-off technique.

51. The method of claim 43 further including forming a buffer layer between said multilayer stack and said supplemental multilayer stack.

52. The method of claim 51 where in said buffer layer has a thickness dependent upon the wavelength of said EUV illuminating radiation, the real portion of the index of refraction of the etching stop layer (n), and the angle of incidence of the EUVL irradiation ($\theta$) by the following relationship:

$$\text{Thickness} = m\lambda/(2n \cos \theta)$$

where m is an integer.

53. The mask of claim 51 wherein said buffer layer has a thickness that provides an optical path that is an integer multiple of $2\pi$.

54. The method of claim 51 wherein said buffer layer is formed from carbon, chromium, oxide, or ruthenium.

55. The mask of claim 43 wherein said recesses have a depth approximately $1/(4 \cos \theta)$ of the wavelength of said EUV illuminating radiation.

56. The method of claim 48 further comprising:

etching said absorptive layer such that said absorptive layer is recessed into said trenches; and removing said contrast layer.

* * * * *

UNITED STATES PATENT AND TRADEMARK OFFICE
CERTIFICATE OF CORRECTION

PATENT NO.      : 6,607,862 B2                                            Page 1 of 1
DATED           : August 19, 2003
INVENTOR(S)     : Yan et al.

It is certified that error appears in the above-identified patent and that said Letters Patent is hereby corrected as shown below:

<u>Column 1,</u>
Line 43, delete "UW" and insert -- UV --.

<u>Column 14,</u>
Line 13, delete "EIJVL" and insert -- EUVL --.

Signed and Sealed this

Thirtieth Day of March, 2004

JON W. DUDAS
*Acting Director of the United States Patent and Trademark Office*